United States Patent [19]

Maly et al.

[11] Patent Number: 5,025,344
[45] Date of Patent: Jun. 18, 1991

[54] BUILT-IN CURRENT TESTING OF INTEGRATED CIRCUITS

[75] Inventors: Wojciech P. Maly, Pittsburgh, Pa.; Phillip J. Nigh, Peekskill, N.Y.

[73] Assignee: Carnegie Mellon University, Pittsburgh, Pa.

[21] Appl. No.: 483,569

[22] Filed: Feb. 22, 1990

Related U.S. Application Data

[63] Continuation-in-part of Ser. No. 277,352, Nov. 30, 1988, abandoned.

[51] Int. Cl.$^5$ ............................................. H02H 3/16
[52] U.S. Cl. ........................................ 361/88; 361/42; 361/86; 361/101; 340/650; 324/73.1; 371/21.4; 371/22.5
[58] Field of Search ...................... 361/42, 45, 54–58, 361/87, 93, 100, 91, 86; 340/650; 324/73 PC, 51; 323/276–279; 371/3, 20, 72

[56] References Cited

U.S. PATENT DOCUMENTS

| | | | |
|---|---|---|---|
| 4,354,217 | 10/1982 | Mahon | 361/101 |
| 4,441,136 | 4/1984 | Hampshire | 361/88 |
| 4,551,779 | 11/1985 | Murakami et al. | 361/86 |
| 4,555,742 | 11/1985 | Gray et al. | 361/101 |
| 4,646,299 | 2/1987 | Schinabeck et al. | 371/20 |
| 4,704,654 | 11/1987 | Aberleu et al. | 361/91 |
| 4,849,847 | 7/1989 | McIver et al. | 361/88 |

*Primary Examiner*—Todd E. Deboer
*Attorney, Agent, or Firm*—Irving M. Freedman

[57] ABSTRACT

A built in current sensor on a unitary substrate with an integrated circuit is provided to sense abnormal quiescent current flow through the integrated circuit after a timing phase as an indication of defects such as shorts and open circuits, while ignoring normal high current peaks. A comparator is provided along with an adjustable reference current to provide a virtual ground voltage which represents that induced by a normal quiescent current through a fault-free integrated circuit. A breaker circuit may be provided for indication, or power disconnection of the integrated circuit, upon the occurrence of current flow above a predetermined value.

17 Claims, 2 Drawing Sheets

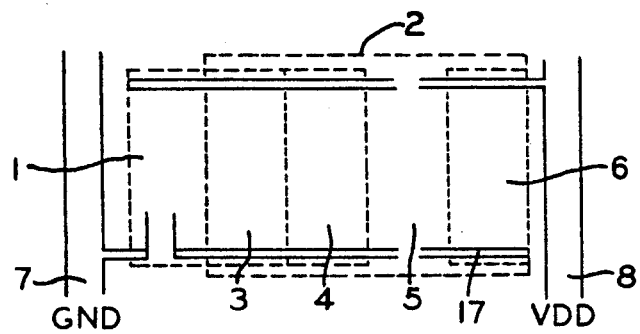
FIG. 1
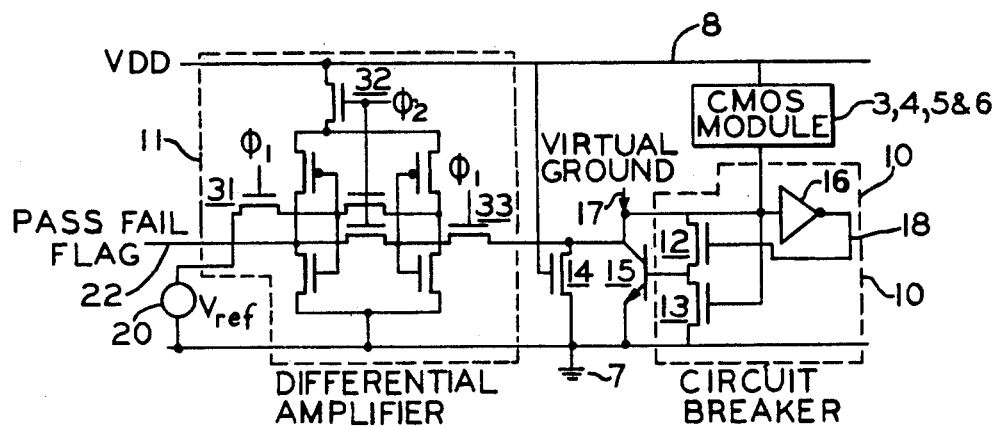
FIG. 2
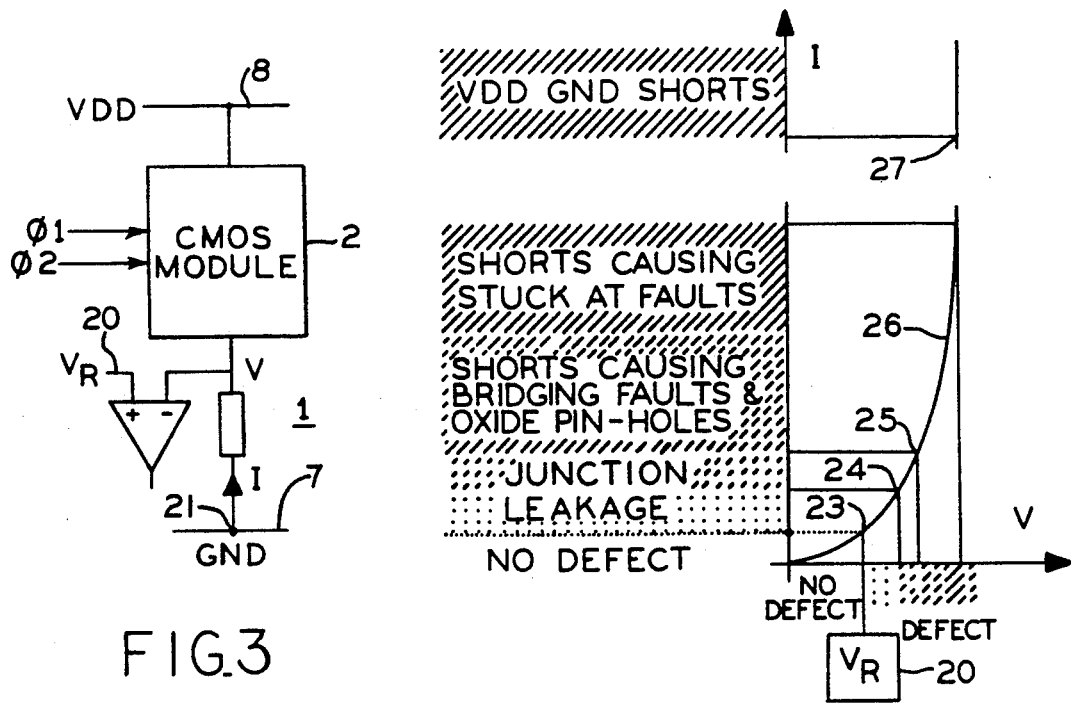
FIG. 3
FIG. 9

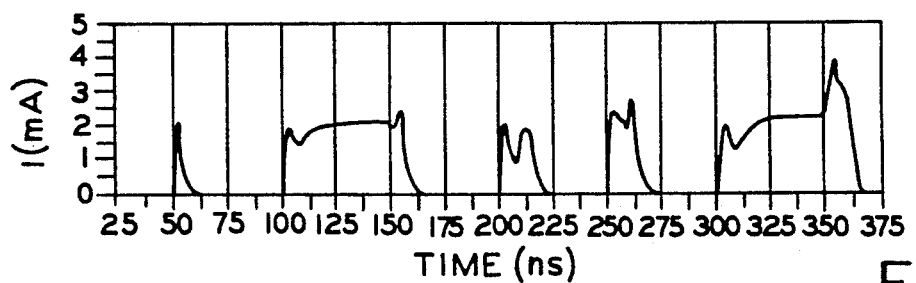
FIG_4
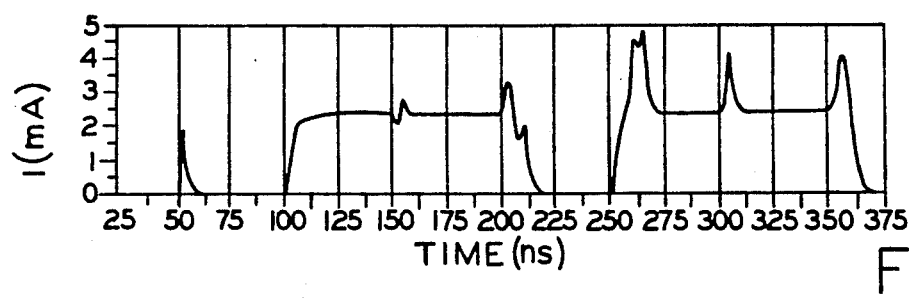
FIG_5
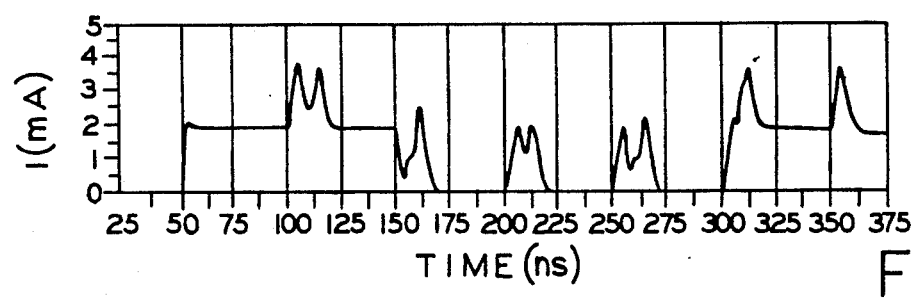
FIG_6
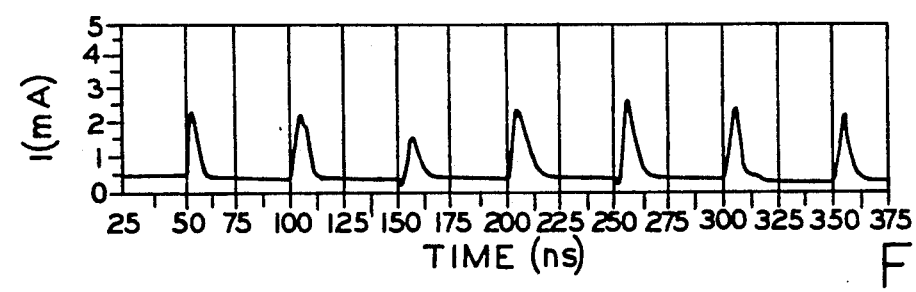
FIG_7
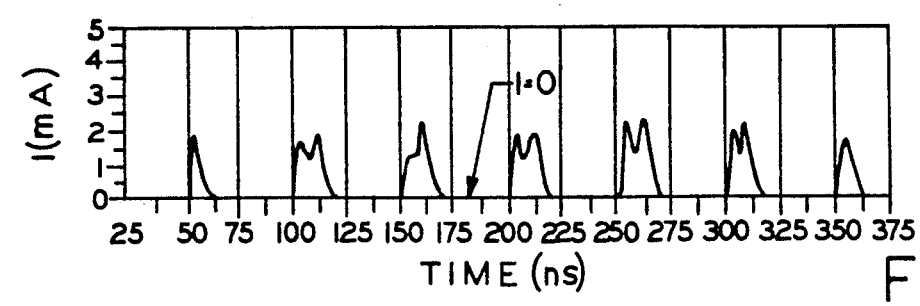
FIG_8

BUILT-IN CURRENT TESTING OF INTEGRATED CIRCUITS

BACKGROUND OF INVENTION

The present invention is a continuation-in part based on U.S. Pat. application Ser. No. 277,352 filed by the inventors hereof, Wojciech P. Maly and Phillip J. Nigh on Nov. 30, 1988, and now abandoned, the benefit of which filing date is hereby claimed for the common subject matter contained therein.

The present invention relates to the self-testing of integrated electronic circuits and, more particularly, to the testing of integrated circuits using built-in current (or BIC) testing apparatus and procedures.

For a number of reasons, including applications, performance, and manufacturing cost, the complexity of VLSI circuits is steadily increasing, making the development of suitable test procedures for such circuits and the performance of tests very costly. More important, the quality and accuracy of various testing procedures is less than desired. It is extremely desirable to detect and reject defective circuits prior to their incorporation into complex electronic equipment such as computers.

Local disturbances or contaminations in the manufacturing process such as droplets of contaminating liquids deposited on the surface of the silicon manufacturing wafer, airborne dust particles and substrate dislocations, may cause many defects. Examples of local defects are spots of extra or missing material in any conducting, semiconducting or insulating layer, pinholes in oxide, and dislocations. A spot of extra metal may cause a short between a signal and $V_{DD}$ line or between two signal lines. Thus, IC malfunctions are frequently caused by a short or an open circuit, in which a short is any conducting path between previously nonequipotential nodes while an open is any permanent break of an equipotential region into two or more non-equipotential regions.

Testing is performed to assure proper functionality of an IC over a period of time. Therefore testing should be able to detect defects which may cause a malfunction of the IC. In reality, however, practical testing must usually be limited to a procedure that compares the desired and actual behaviors of an IC for a given and usually limited subset of all possible inputs.

The most common method of testing is to drive the circuit with known inputs and evaluate the operation of the circuit by observing the outputs of the circuit under test. However some circuit nodes are difficult to test with such procedures because it may be difficult to achieve adequate observability and controllability of these nodes. Also, circuit defects may manifest themselves in a manner which may be difficult to detect by observing circuit's outputs.

To overcome this limitation, off-chip current testing has been proposed. It can be used to detect gate oxide pinholes or excessive function leakages as well as opens and shorts. While such off-chip current testing is desirable and useful in terms of testing for product reliability and possible future failures, a practical implementation is difficult and expensive. A limitation of off-chip current testing is due to the large amount of capacitance related to the test equipment and the IC's power bus pads which reduce the measurement speed by a couple of orders of magnitude as compared to the BIC sensor of the present invention. Off-chip current testing has inherent resolution limits and is difficult to apply with existing test equipment.

Higher resolution current sensing is needed in order to distinguish defects from normal circuit currents which may fluctuate due to normal circuit operations such as switching, noise, and other phenomena. The other problem is that, in modern VLSI systems a vast majority of the current flows in the input-output (I/0) drivers whose fluctuations dominate and overshadow a majority of current abnormalities which might occur in other components of the circuit. Consequently, off-chip current testers encounter problems in detecting small abnormal currents.

A characteristic of IC circuits such as CMOS circuits is a wide range of operating currents. In such circuits, peak values of transient currents may be many orders of magnitude larger than the same circuits' quiescent currents. A BIC sensor must therefore be able to handle this large range of currents, while only negligibly affecting the power bus voltages supplied to the monitored modules. Furthermore, the BIC sensor must be able to resolve the very fine differences between faulty and "fault-free" quiescent currents. Therefore, the sensor should be able to maintain good resolution in the very low ranges of current.

OBJECTS AND SUMMARY OF INVENTION

It is an object of the present invention to provide an improved high resolution on-chip tester for integrated circuits.

Another object of the present invention is to provide an on-chip current tester for integrated circuits which can detect both short and open circuits.

Still another object of the present invention is to provide an on-chip tester which will decrease the cost of testing and which will cover an increased variety of defect categories.

Yet another object of the present invention to provide on-chip tester for IC circuits which will cover a wide range of operating currents yet still detect fine differences between the quiescent currents in faulty and fault free circuits.

A further object of the present invention provide an on-chip tester for IC circuits which can maintain good resolutions even for very low currents.

A still further object of the current invention is to perform concurrent passive testing of integrated circuits during normal operation of the circuit to detect radiation induced latch-up or other transient faults.

A yet further object is to provide an on-chip tester for IC circuits the measurement speed of which matches the circuit under test.

In carrying out the above and other objects, there is provided in one embodiment, an on-chip built-in current sensor for the testing of integrated circuits to monitor power bus currents in an integrated circuit. Modules of the VLSI circuit are connected to the global ground (or $V_{DD}$) bus through a current sensor. The built-in current tester is made responsive to abnormal quiescent current flow while ignoring normal high current pulses. It is accomplished by using a comparator which compares a voltage drop generated by the defect related quiescent current against a reference voltage which is a component of the BIC sensor. Abnormal quiescent currents provide voltages between ground and virtual ground, i.e. the local ground of the VLSI module 2. Timing signals are used for the quiescent current testing. A circuit breaker may be provided in parallel with the comparator to disconnect power to the tested module when the quiescent current through this module exceeds a predetermined current level. The BIC sensor can be used as a stand alone built-in tester or in combination with an external tester. One advantage of this invention is that the speed of testing matches the speed of the circuit under test.

BRIEF DESCRIPTION OF THE DRAWINGS

FIG. 1 is a diagram showing a BIC sensor in accordance with a preferred embodiment of the present invention.

FIG. 2 is a schematic diagram of a BIC sensor of FIG. 1 in accordance with a preferred embodiment of the present invention.

FIG. 3 illustrates in simplified form the connection of the BIC sensor of FIGS. 1 and 2.

FIGS. 4-8 show current flow through integrated circuits having various defects, compared with current flow through a defect-free integrated circuit.

FIG. 9 illustrates a range if current flows through, and resultant voltages in, the BIC sensor caused by various defects.

DESCRIPTION OF A PREFERRED EMBODIMENT

FIG. 1 is a simplified showing of a CMOS module in accordance with one embodiment of the present invention, while FIG. 3 illustrates connection of the major elements in schematic form. Referring to FIGS. 1 and 3, the BIC sensor 1 is located next to a CMOS module 2, a portion or part of which is composed of a number of cells 3, 4, 5, and 6, all of which are connected between the ground or virtual ground 7 and the global ground or power bus $V_{DD}$ 8 of the IC 2. In a complex large IC 2 there can be a number of BIC sensors 1 connected is series with various portions of the integrated circuit for testing those portions independent of other portions of the IC. In a less complex IC, the portion connected in series with the BIC sensor may constitute the entire IC. The BIC sensor, which is shown in more detail in FIG. 2, could also have been placed between the modules 3, 4, 5 and 6 and the global around 8.

Referring next to FIG. 2, the BIC sensor 1 includes two distinct and independent sets of fault-detecting circuitry—a switching circuit or circuit breaker shown within box 10 and responding to high currents; and a quiescent current sensor or differential amplifier responding to differences in small quiescent currents and shown schematically within box 11. The circuit breaker 10 includes transistors 12, 13, 14 and 15 and amplifier 16 connected as shown.

The circuit breaker portion 10 of the BIC sensor 1 detects and reacts to low impedance $V_{DD}$ 8 to Local Ground 17 permanent shorts in the CMOS module 3, 4, 5 and 6. During normal operation of the CMOS module 10, the node 17 labelled Virtual Ground will be at logic 0 and the node 18 will be near 5 volts. Transistor 12 will be on, and 13 will be off. Thus, during normal operation the bipolar junction transistor, or BJT, 15 acts as a forward-biased diode, and appears only during transient current peaks as an extra voltage drop between the module's virtual ground and true ground. Virtual Ground 17 and Local Ground 7 are connected.

When a $V_{DD}$ 8 to Local Ground 17 short is present, the bistable circuit breaker 10 will automatically power-up into its non-conducting state. As the voltage on the Virtual Ground 17 is pulled up with the $V_{DD}$ 8, transistor 13 will turn on, thus beginning to switch BJT 15 off. As the Virtual Ground 17 voltage continues to rise with that of $V_{DD}$ 8, transistor 12 eventually switches off as well. The final result of this positive feedback process is that the BJT 15 will be completely cut off, thus isolating the faulty module from the power supply as desired.

The trickle pull-down transistor 14 ensures that the bistable protection circuitry will power-up into the correct conducting state. During normal operation, this transistor 14 will not significantly affect the circuit currents. If the BIC sensor 1 is in its non-conducting state, however, transistor 14 will pass a small constant current. When the voltage of the Virtual Ground 17 equals approximately 5 volts, transistor 14 has a calculated resistance of 250K ohms. The transistor 14 was designed to provide as large a resistance as possible subject to space limitations in the CMOS IC 2.

The main portion of BIC sensor 1 is controlled by the timing signals Phi 1 and Phi 2 applied to the pass transistors 31, 32 and 33 of the differential amplifier 11 as shown in FIG. 2. Phi 1 and Phi 2 are non-overlapping and are synchronized with the main clock such that Phi 1 is high and Phi 2 is low at the beginning of each clock cycle, and Phi 1 is low and Phi 2 is high during the second part of the main clock cycle. The BIC sensor 1 compares the reference voltage $V_{ref}$ 20 and the voltage at the Virtual Ground 17 during the second half of the main clock cycle when Phi 2 is high and Phi 1 is low.

$V_{ref}$ 20 is compared with the virtual ground voltage 17, which is produced by the quiescent current only, and large peak currents of the CMOS module 3, 4, 5 and 6, are "invisible" or are ignored by the differential amplifier 11. These currents are much more difficult to detect than the currents detected by the optional circuit breaker 10. The two-phase clocked differential amplifier enables high resolution of the low current sensing even in the presence of a low voltage drop across the bipolar junction transistor current sensor 15 with high values of this voltage drop observed at the end of the clock cycle provided through the phased signals Phi 1 and Phi 2 indicating the existence of a defect. The wide range of operating currents in the CMOS circuits such as 3, 4, 5 and 6 may be many orders of magnitude larger than the quiescent currents. The present invention can handle such a wide range while only negligibly affecting the local ground bus 17 and $V_{DD}$ 8 of the CMOS modules, and at the same time being able to resolve fine differences between the faulty and fault-free quiescent currents at the end of the clock cycles.

The amplifier 11 thus compares the module's Virtual Ground 17 voltage with a reference voltage 20 through the differential amplifier 11 shown schematically in FIG. 2. The reference or source voltage 20 is adjusted to represent the Virtual Ground voltage 17 induced by a normal static current through the CMOS modules 3, 4, 5 and 6. Transistor sizing in this amplifier were made on the basis of careful SPICE computer simulations. The layout of the BIC current sensor was kept as symmetrical as possible to reduce any voltage offset in the differential amplifier 11. A difference of as little as one decade of current between faulty and fault-free CMOS modules 3, 4, 5 and 6 requires a switching resolution of approximately 30 millivolts in the differential amplifier or current sensor 11.

In one version of the BIC sensor 1 the current sensor 11 used an externally supplied reference voltage connected as shown in FIG. 2, and indicated or reported its pass-fail decisions off-chip by way of the pass-fail flag 22. However, the reference voltage 20 may conveniently be an integral part of the BIC sensor, that is fabricated as part of the CMOS IC 2, and the decision of the current sensor 11 may be latched and fed directly back into the same decision circuitry which the switching circuit 10 uses. Since a faulty module may pass abnormal current only for some input combinations, a fully self-checking circuit should latch the fault signal which would be fed back into the circuit breaking logic 10 to the right of the BJT in FIG. 2.

In practice, and by way of example and illustration, the measured static quiescent current due to a fault comprising a spot of metal which created a bridging fault in a cell or module such as 3, 4, 5 or 6 was approximately 6 milliamps in excess of that of a fault-free module. The BIC sensors were able to accurately differentiate a faulty module from a good module for a reference voltage 20 in the range of 150 to 850 millivolts, and also at speeds of 6.7 megahertz.

In operation, a 15 transistor sensor could detect a single short in a 1800 transistor 16-bit full adder (adding only approximately 0.8% to the transistor count) and resolved voltage differences of less than 10 millivolts. That is, the design met the basic requirements of being small, causing only a small degradation of the performance of the monitored module and provided sufficient current resolution.

FIGS. 4-8 show typical currents flowing through ground 7 and the CMOS module 3, 4, 5 and 6 and which illustrate defect and defect-free current flow. Current flow in milliamps on the Y axes are plotted against time in nanoseconds on the X axes. FIGS. 4 through 7 show current flow in ICs with various defects, while FIG. 8 shows current flow in a defect-free IC circuit. Referring first to FIG. 8 at the beginning of each cycle, which begins each 50 nanoseconds, such as 50, 100 and 150 nanoseconds, a large transient current occurs then decreases quickly such that at the end of each cycle it is close to zero, at a quiescent current level. The quiescent value may vary for different IC circuits. This decrease to zero or near zero current flow does not occur in defective circuits such as shown in FIGS. 4 through 7. Referring next to FIGS. 4 through 7. FIG. 4 shows the current flow resulting from a metal bridge between two nodes including one at the intersection of a plurality of transistors in an adder circuit. FIG. 5 shows current flow with a fault bridging 2 polysilicon lines. FIG. 6 shows current flow with a gate oxide pinhole defect. FIG. 7 shows current flow where a contact hole is missing disconnecting two gates in an IC 2 causing the gates to float. The various defects of FIGS. 4 through 7 cause quiescent currents above at the end of each cycle which is significantly above that shown in FIG. 8.

It is to be noted that in the defect-free IC at FIG. 8 at the beginning of each cycle there is a large transient current flow which decreases such that at the end of each clock cycle it is close to zero. This is the quiescent current. However, it is to be noted that in the case of the defective circuits in FIGS. 4 through 7, the quiescent current shortly after each pulse is frequently, although not always, greater than zero. The quiescent currents in FIGS. 4–7 are elevated for significant periods of time during some specific clock cycles.

The present invention is used to determine the level of the quiescent current at the end of the clock cycle established by Phi 1 and Phi 2 of the IC CMOS modules 3, 4, 5 and 6. In addition, and of significance, the present invention ignores the transient currents at the beginning and during each cycle, thus making it insensitive to high levels of peak current flow.

It is to be noted that the circuit breaker 10 is, on the other hand, responsive to all, and only, high currents which may pass through the CMOS modules 3, 4, 5 and 6. The circuit breaker 10 is designed to actuate at a predetermined high current flow, much higher than the quiescent current flows used to test and indicate various types of defective IC circuits as discussed above in connection with FIGS. 4 through 8 and the current sensor or tester 11. Thus, the present invention provides two different levels of response in which the current sensor 11 detects fine differences between low quiescent currents over a wide range of operating currents, and is able to maintain good resolution even in the presence of very low ranges of currents which enables it to detect a wide range of defects, including both short and open circuits, and even including radiation induced latch-up or other transient faults.

FIG. 9 graphically shows how various faults in the CMOS module 3, 4, 5 and 6 provide different quiescent current flows in the BIC sensor 1. Quiescent current flow is indicated on the Y axis, while the voltage across the BJT 15 is indicated on the X axis. Referring to FIG. 5, it is seen that the reference voltage 20 provides a zero quiescent current flow 23 for CMOS modules without a defect, while junction leakage defects result in an increased abnormal quiescent current flow 24 which exceeds the normal quiescent current flow 23 of fault-free ICs Shorts may result in still higher quiescent current flows which, as shown in FIG. 9, shorts causing bridging faults and oxide pinholes result in higher current flow 25 than junction leakage current flow 24, while shorts causing stuck at faults result in even higher current flow 26. Also, shorts between ground 7 and the global ground $V_{DD}$ 8 result in extremely high current flow 27 which would if the circuit breaker 10 is included, actuate the circuit breaker 10.

Computer simulations conducted during the development of the present invention using real data collected from a real IC manufacturing process involving the simulation of over 200,000 defects indicated that all of the analyzed short circuits caused static current in the voltage supply, and some of the simulated open circuits caused abnormal currents such that current testing in the case of the circuit analyzed (a full adder) was practical.

The first and most obvious application of BIC testing is self-testing. There are two possible options as far as the BIC self-testing mode of operation is concerned. The BIC self-testing may be used as the only method of testing. Alternatively, BIC testing may be followed by, or done simultaneously with, ordinary voltage testing. The first approach to testing is very attractive because it does not require an external tester. An external tester would provide low voltage to the normal inputs of the CMOS module 2 and check for the expected outputs at the output terminals.

If the defect detectability which can be achieved with BIC testing is lower than required for the desired manufacturing yield, the BIC testing should be followed by a typical testing phase using an external tester. In this procedure, a significant savings in the testing time ca also be achieved through the BIC testing. This savings can be estimated by the product $D_\theta(1-Y)$ where $D_\theta$ is the defect detectability which can be achieved with BIC testing and Y is the manufacturing yield. If $Y=20\%$ and $D_{74}=90\%$, then 72% of the tested dies are found defective by using BIC testing and only a small percentage of the dies have to be further tested using a tester.

While BIC sensing for IC testing does produce some inherent performance degradation due to the voltage drop across the current sensor, it does not seem to be especially significant. Hence, one can simply use ICs with the BIC sensors permanently located at the GND rails. In the case, however, when the current sensors cannot be accepted in the power buses, one of the two options can be applied: connection of extra internal pads which are grounded after testing or multiple bonding pads. In this solution, current sensors have to be appropriately configured to handle modules connected to a single GND pad. During testing, a common GND pad is used, and after testing ordinary GND pads are use while current sensors are disconnected.

Hence, BIC self-testing offers a certain quality of testing which does not require an application of an external tester and therefore is economically extremely attractive. It can also be used in combination with traditional testing to potentially save a very large portion of the testing costs.

An important feature of BIC self-testing is that it can be performed concurrently through a passive monitoring of power supply currents during normal system operation. This provides a unique opportunity for the detection of arising reliability problems, such as increased leakage currents and metal migration degradation before disabling faults occur. Even more important, some of the defects may be detected before an actual fault occurs. Some defects do cause increased currents while the circuit still performs its logical function. Hence, BIC self-testing can provide a very powerful option for defect tolerant computing. This ability to generate a kind of "early warning" before any disabling faults occur can be of enormous significance in high reliability circuits.

Also, BIC testing is very convenient for defect tolerant systems in which detection of defects must be followed by a system reconfiguration step in which faulty functional blocks are replaced with identical redundant blocks. This reconfiguration is straightforward if BIC sensors are used, since the defective functional block can be simply disconnected from the power supply bus by disabling the current sensing device, i.e. by putting the bipolar device or circuit breaker 10 into the off state.

While the invention has been described in specific embodiments, it will be understood that modifications may be made by those skilled in the art, and it is intended by the appended claims to cover all such modifications and changes as fall within the true spirit and scope of the invention.

We claim:

1. A semiconductor integrated circuit comprising:
 a main circuit assembly and a built-in current testing fault-detecting assembly on a unitary substrate;
 said fault-detecting assembly being connected in circuit with at least a portion of said main circuit assembly to detect the quiescent current flow through said integrated circuit portion a predetermined period after the application of timing signals to said built-in current testing fault-detecting assembly;
 said fault-detecting assembly and integrated circuit portion being connected in series between local ground and the global ground of said integrated portion; and
 said fault-detecting assembly being responsive to abnormal quiescent current flow through said integrated circuit portion while ignoring normal high operational currents in said integration circuit during the timing period as an indication of defects within said integrated circuit portion;
 whereby the speed of said fault detecting assembly matches the circuit under test.

2. The semiconductor integrated circuit of claim 1 wherein said fault-detecting assembly includes a differential amplifier responsive to said abnormal current flow while ignoring said normal high currents.

3. The semiconductor integrated circuit of claim 2 wherein a first timing signal and a second timing signal are provided to said fault-detecting assembly to establish timing periods for the detection of the quiescent current flow through said fault-detecting assembly.

4. The semiconductor integrated circuit of claim 3 wherein said fault-detecting assembly includes a reference voltage which is adjusted such that the virtual ground voltage of said fault-detecting assembly represents that induced by a normal quiescent current flow through a fault-free integrated circuit portion.

5. The semiconductor integrated circuit of claim 4 wherein said first and second timing signals are provided by a timer and are applied out of phase to said differential amplifier.

6. The semiconductor integrated circuit of claim 5 wherein current flow in said fault detecting assembly occurring at the beginning and during the periods established between reversal of polarity of said first and second timing signals indicates a fault in said integrated circuit when the quiescent current flow does not decrease to substantially zero during said timing periods.

7. A semiconductor integrated circuit comprising:
 a main circuit assembly and a built-in current testing fault-detecting assembly on a unitary substrate;
 said fault-detecting assembly being connected in circuit with at least a portion of said main circuit assembly to detect the quiescent current flow through said integrated circuit portion;
 said fault-detecting assembly and integrated circuit portion being connected in series between local ground and the global ground of said integrated portion;
 said fault-detecting assembly including a differential amplifier responsive to abnormal quiescent current flow through said integrated circuit portion while ignoring normal high operational currents in said integration circuit as an indication of defects within said integrated circuit portion; and
 a transistor connected between virtual ground and global ground which is responsive to the quiescent current flow through said integrated circuit;
 whereby the magnitude of the abnormal current flow through said fault detecting assembly is indicative of the nature of the fault in said integrated circuit.

8. The semiconductor integrated circuit of claim 7 wherein said fault detecting assembly is responsive to substantially small differences in quiescent current providing high resolution at low current levels which are significantly below the level of the high currents ignored by said fault detecting assembly.

9. The semiconductor integrated circuit of claim 7 wherein said fault-detecting assembly includes a circuit breaker actuated in response to predetermined high current flow through said integrated circuit.

10. The semiconductor integrated circuit of claim 9 wherein said circuit breaker is connected in parallel with said transistor.

11. The semiconductor integrated circuit of claim 10 wherein circuitry is provided in said circuit breaker to indicate a high latch-up related current fault in said portion of said main circuit assembly.

12. The semiconductor integrated circuit of claim 1 wherein said circuit breaker is connected to turn off the power to said integrated circuit upon the occurrence of a high current fault in excess of a second predetermined current flow in said integrated current portion.

13. The semiconductor integrated circuit of claim 1 wherein an external voltage tester is connectable to the integrated circuit to enable use of the external tester in combination with said built-in fault-detecting current tester assembly.

14. The semiconductor integrated circuit of claim 13 wherein the magnitude of the abnormal current flow through said differential amplifier is indicative of the nature of the fault in said integrated circuit.

15. The semiconductor integrated circuit of claim 7 wherein one or more additional integrated circuit portions are connected in circuit with an additional fault detecting assembly for each of said integrated circuit portions.

16. The semiconductor integrated circuit of claim 15 wherein said fault-detecting assemblies comprises a differential amplifier including phased signals Phi 1 and Phi 2 responsive to abnormal quiescent current flow therethrough while ignoring normal high current peaks in said integrated circuit.

17. The semiconductor integrated circuit of claim 16 wherein each of said reference voltages is adjusted such that the virtual ground voltage of each of said fault-detecting assemblies represents that induced by a normal quiescent current through a fault-free integrated circuit portion.

* * * * *